United States Patent
Ishizone et al.

(10) Patent No.: US 7,499,248 B2
(45) Date of Patent: Mar. 3, 2009

(54) MAGNETIC DETECTIVE HEAD COMPRISING FREE LAYER

(75) Inventors: Masahiko Ishizone, Niigata-ken (JP); Masamichi Saito, Niigata-ken (JP); Yosuke Ide, Niigata-ken (JP); Naoya Hasegawa, Niigata-ken (JP)

(73) Assignee: TDK Corporation, Tokyo (JP)

( * ) Notice: Subject to any disclaimer, the term of this patent is extended or adjusted under 35 U.S.C. 154(b) by 374 days.

(21) Appl. No.: 11/373,575

(22) Filed: Mar. 10, 2006

(65) Prior Publication Data

US 2006/0203398 A1 Sep. 14, 2006

(30) Foreign Application Priority Data

Mar. 11, 2005 (JP) ............................ 2005-068874

(51) Int. Cl.
*G11B 5/39* (2006.01)

(52) U.S. Cl. ................................. 360/324.12

(58) Field of Classification Search ............... None
See application file for complete search history.

(56) References Cited

U.S. PATENT DOCUMENTS

2004/0165320 A1 8/2004 Carey et al.
2005/0073778 A1* 4/2005 Hasegawa et al. ........ 360/324.1

FOREIGN PATENT DOCUMENTS

JP 2004/260149 9/2004

* cited by examiner

*Primary Examiner*—Mark Blouin
(74) *Attorney, Agent, or Firm*—Brinks Hofer Gilson & Lione

(57) ABSTRACT

A free magnetic layer is a laminated body of a $Co_2MnZ$ alloy layer (Z is one or more elements selected from a group consisting of Al, Sn, In, Sb, Ga, Si, Ge, Pb, and Zn) and a $Co_aFe_{100-a}$ alloy layer. The $Co_aFe_{100-a}$ alloy layer has a composition ratio $76 \leq a \leq 100$ or a face-centered cubic (fcc) structure, in which an equivalent crystal face expressed as a $\{111\}$ plane is preferentially oriented in a direction parallel to a film surface, and the $Co_aFe_{100-a}$ alloy layer is in contact with the nonmagnetic material layer.

9 Claims, 5 Drawing Sheets

MAGNETIC DETECTIVE HEAD COMPRISING FREE LAYER

BACKGROUND OF THE INVENTION

1. Field of the Invention

The present invention relates to a CPP (current perpendicular to the plane) type magnetic detecting element that allows a sense current to flow in a direction perpendicular to the surface of a film, and more specifically, to a magnetic detecting element having a small magnetostriction constant λs and excellent soft magnetic properties.

2. Description of the Related Art

FIG. 5 is a partial cross-sectional view of a related art magnetic detecting element (spin valve type thin film element) H5 cut along a surface facing a recording medium.

Reference numeral 1 shown in FIG. 5 is a foundation layer formed of Ta, and a seed layer 2 formed of a bcc (body-centered cubic) structured metal such as Cr is formed on the foundation layer 1.

A multilayer film T, in which an antiferromagnetic layer 3, a fixed magnetic layer 4, a nonmagnetic material layer 5, a free magnetic layer 6, and a protective layer 7 are laminated sequentially, is formed on the seed layer 2.

The protective layer 7 is formed of Ta; the nonmagnetic material layer 5 is formed of Cu; the free magnetic layer 6 is formed of a ferromagnetic material such as CoFe or the like; the fixed magnetic layer 4 is formed of Heusler alloy such as $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn); and the antiferromagnetic layer 3 is formed of an antiferromagnetic material such as PtMn or the like.

Electrode layers 10 and 10 are provided on upper side and lower side of the multilayer film T1, and a sense current, which is a direct current, flows in a direction perpendicular to the surface of the multilayer film.

An exchange-coupling magnetic field is generated at the interface between the antiferromagnetic layer 3 and the fixed magnetic layer 4, and the magnetization of the fixed magnetic layer 4 is fixed in a height direction (a Y direction in the drawings).

Hard bias layers 8 formed of a hard magnetic material such as CoPt or the like are formed on both sides of the free magnetic layer 6, and the top, bottom, and end of each hard bias layer 8 are insulated by an insulating layer 9. Magnetization of the free magnetic layer 6 is directed in a track width direction (an X direction in the drawing) by a longitudinal bias magnetic field from the hard bias layers 8.

If an external magnetic field is applied to the magnetic detecting element H5 shown in FIG. 5, the magnetization direction of the free magnetic layer changes relative to the magnetization direction of the fixed magnetic layer, and thus the resistance of the multilayer film changes. While a sense current with a fixed current is flowing, the external magnetic field is detected by detecting the change of the resistance as a voltage change.

The above magnetic detecting element is described in JP-A-2004-260149 (U.S. Pub. No. 2004/0165320 A1) In the magnetic detecting element described in JP-A-2004-260149, magnetization of the ferromagnetic layer is properly fixed in the height direction (the Y direction in the drawing) by using a Heusler alloy in the ferromagnetic layer functioning as the fixed magnetic layer 4 shown in FIG. 5 to obtain a magnetic detecting element having desirable properties.

In order to improve properties of a magnetic detecting element, it is very important to improve the soft magnetic properties by decreasing a magnetostriction constant λs. However, use of a Heusler alloy in the fixed layer 4 shown in FIG. 5 cannot improve the properties of the magnetic detecting element satisfactorily.

SUMMARY OF THE INVENTION

The invention has been made to solve the above-described problems inherent in the related art, and it is an object of the invention to provide a magnetic detecting element with a small magnetostriction constant λs and excellent soft magnetic properties.

According to a first aspect of the invention, a magnetic detecting element includes a multilayer film that has a fixed magnetic layer, the magnetization direction of which is fixed in one direction, and a free magnetic layer formed on the fixed magnetic layer with a nonmagnetic material layer therebetween, a current flowing in a direction perpendicular to a film surface of each layer of the multilayer film. Here, the free magnetic layer has a laminated body of a $Co_2MnZ$ alloy layer (Z is one or more elements selected from a group consisting of Al, Sn, In, Sb, Ga, Si, Ge, Pb, and Zn) and a $Co_aFe_{100-a}$ alloy layer ('a' indicates composition ratio, $76 \leq a \leq 100$), and the $Co_aFe_{100-a}$ alloy layer is in contact with the nonmagnetic material layer.

According to this configuration, the properties of the free magnetic layer can be improved by setting the composition ratio of the $Co_aFe_{100-a}$ alloy layer overlaying the $Co_2MnZ$ alloy layer within the above described range and forming the $Co_aFe_{100-a}$ alloy layer in contact with the nonmagnetic material layer.

In this case, it is preferable that the free magnetic layer has a laminated body of the $Co_2MnZ$ alloy layer (Z is one or more elements selected from a group consisting of Al, Sn, In, Sb, Ga, Si, Ge, Pb, and Zn) and the $Co_aFe_{100-a}$ alloy layer ('a' indicates composition ratio, $76 \leq a \leq 100$).

According to a second aspect of the invention, a magnetic detecting element includes a multilayer film that has a fixed magnetic layer, the magnetization direction of which is fixed in one direction, and a free magnetic layer formed on the fixed magnetic layer with a nonmagnetic material layer therebetween, a current flowing in a direction perpendicular to a film surface of each layer of the multilayer film. Here, the free magnetic layer has a laminated body of $Co_2MnZ$ alloy layer (Z is one or more elements selected from a group consisting of Al, Sn, In, Sb, Ga, Si, Ge, Pb, and Zn) and $Co_aFe_{100-a}$ alloy layer. Further, the $Co_aFe_{100-a}$ alloy layer has a face-centered cubic (fcc) structure, and an equivalent crystal plane expressed as a {111} plane is preferentially oriented in a direction parallel to a film surface, and the $Co_aFe_{100-a}$ alloy layer is in contact with the nonmagnetic material layer.

According to this configuration, the properties of the free magnetic layer can be improved by making the crystal structure of the $Co_2MnZ$ alloy layer as described above and forming the $Co_aFe_{100-a}$ alloy layer in contact with the nonmagnetic material layer.

Further, it is preferable that a film thickness of the $Co_aFe_{100-a}$ alloy layer be in the range of 10 to 30 Å.

Further, it is preferable that the magnetostriction constant λs of the free magnetic layer be in the range of 0 ppm to 15 ppm.

Further, the fixed magnetic layer can have a $C_2YZ$ alloy layer (Y is one or more elements selected from a group consisting of Mn, Fe, and Cr; and Z is one or more elements selected from a group consisting of Al, Ga, Si, Ge, Sn, In, Sb, Pb, and Zn).

The magnetic detecting element according to each of the aspects of the invention is, for example, a top spin valve type CPP-GMR type magnetic detecting element, in which the fixed magnetic layer is provided above the free magnetic layer.

Alternatively, the magnetic detecting element is a bottom spin valve type CPP-GMR type magnetic detecting element, in which the fixed magnetic layer is provided below the free magnetic layer.

Further, the magnetic detecting element is a dual spin valve type CPP-GMR type magnetic detecting element, in which the nonmagnetic material layer and the fixed magnetic layer are provided on a lower side of the free magnetic layer, and another nonmagnetic material layer and fixed magnetic layer are provided on an upper side of the free magnetic layer.

When the magnetic detecting element is a dual spin valve type CPP-GMR type magnetic detecting element, the free magnetic layer is formed by laminating an upper free magnetic layer on a lower free magnetic layer directly or with the other magnetic or nonmagnetic material layer therebetween. When, of a multilayer film lower part composed of the lower free magnetic layer, the nonmagnetic material layer located beneath the lower free magnetic layer, and the fixed magnetic layer; and a multilayer film upper part composed of the upper free magnetic layer, the nonmagnetic material layer located on the upper free magnetic layer, and the fixed magnetic layer, one located upstream of the conduction electron flow is defined as a multilayer film upstream part, and the other located downstream of the conduction electron flow is defined as a multilayer film downstream part, it is preferable that the product ΔRA of the magnetic resistance variation of the multilayer film upstream part and the element area be smaller than the product ΔRA of the multilayer film downstream part.

As a result, it is possible to reduce noise due to spin transfer torque.

The spin transfer torque is a torque that transfers spin angular momentum of conduction electrons to spin angular momentum of magnetic materials forming the free magnetic layer and the fixed magnetic layers and fluctuates the spin angular momentum of the free magnetic layer, when current is allowed to flow perpendicular to the film surface of the multilayer film, in which the free magnetic layer, the nonmagnetic material layer, and the fixed magnetic layers are laminated. When the spin angular momentum of the free magnetic layer fluctuates, noise is superimposed on reproduction outputs, thus reducing the ratio S/N of the magnetic detecting element.

Spin transfer torque generated when conduction electrons are allowed to flow in a direction towards the fixed magnetic layers from the free magnetic layer is smaller than spin transfer torque generated when conduction electrons are allowed to flow in a direction toward the free magnetic layer from the fixed magnetic layers.

Further, in the magnetic detecting element according to the first aspect of the invention, the multilayer film upstream part of the multilayer film of the magnetic detecting element is made asymmetric with the multilayer film downstream part, thereby making the product ΔRA of the magnetic resistance variation of the multilayer film upstream part and the area of the element smaller than the product ΔRA of the multilayer film downstream part.

Accordingly, the spin transfer torque applied to the free magnetic layer of the dual spin valve type magnetic detecting element can be sufficiently offset. Theoretically, when the aspect of the invention is applied, it is possible to reduce the spin transfer torque applied to the free magnetic layer to zero.

Further, in the magnetic detecting element according to the first aspect of the invention, the soft magnetic properties of the free magnetic layer can be improved by setting the composition ratio 'a' of the $Co_aFe_{100-a}$ alloy layer that overlays the $Co_2MnZ$ alloy layer in the range of $76 \leq a \leq 100$ and forming the $Co_aFe_{100-a}$ alloy layer contact with the nonmagnetic material layer.

Further, in the magnetic detecting element according to the first aspect of the invention, the soft magnetic properties of the free magnetic layer can be improved by making the crystal structure of the $Co_aFe_{100-a}$ alloy layer that overlays the $Co_2MnZ$ alloy layer have a face-centered cubic (fcc) structure; preferentially orientating an equivalent crystal plane expressed as a {111} plane in a direction parallel to a film surface; and making the $Co_aFe_{100-a}$ alloy layer contact the nonmagnetic material layer.

DESCRIPTION OF THE PREFERRED EMBODIMENT

Figure 1:
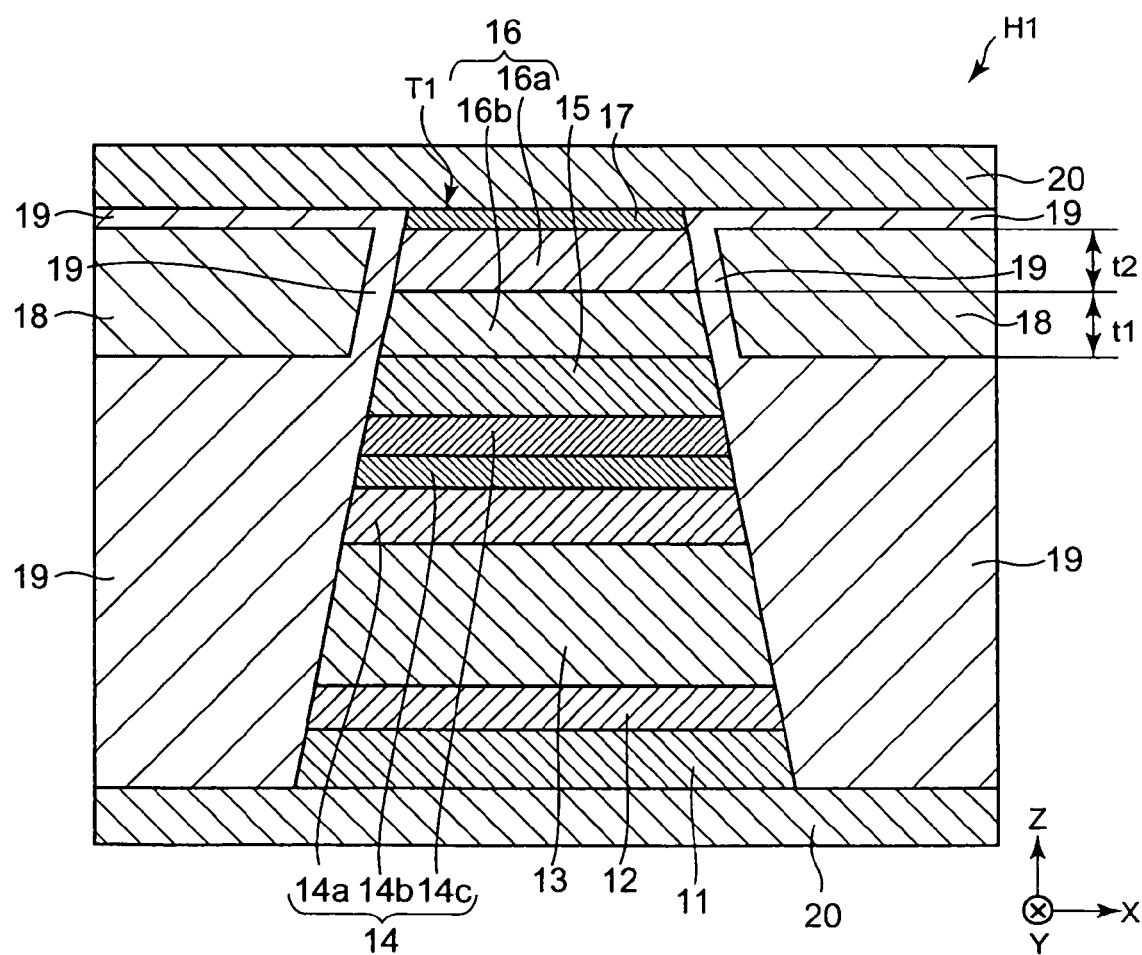
FIG. 1 is a cross-sectional view of a structure of a magnetic detecting element (single spin valve type magnetic resistance effect element) according to a first embodiment of the invention as viewed from a surface facing a recording medium.

FIG. 1 is a cross-sectional view of the entire structure of a magnetic detecting element (single spin valve type magnetic resistance effect element) H1 according to a first embodiment of the invention as viewed from a surface facing a recording medium. Further, FIG. 1 shows only a middle portion of the element extending in the X direction in the drawing.

This single spin valve type magnetic resistance effect element is provided at a trailing-side end or the like of a floating-type slider provided in a hard disk device and detects a recorded magnetic field of a hard disk or the like. The moving direction of a magnetic recording medium such as a hard disk or the like is in the Z direction, and the direction of a leakage magnetic field from the magnetic recording medium is the Y direction in the drawing.

A layer formed at the bottom of FIG. 1 is a foundation layer 11 formed of a nonmagnetic material such as one or more elements or the like selected from a group consisting of Ta, Hf, Nb, Zr, Ti, Mo, and W. A multilayer film T1 composed of a seed layer 12, an antiferromagnetic layer 13, a fixed magnetic layer 14, a nonmagnetic material layer 15, a free magnetic layer 16, and a protective layer 17 is laminated on the foundation layer 11. The magnetic detecting element shown in FIG. 1 is a so-called bottom spin valve type GMR magnetic detecting element in which the antiferromagnetic layer 13 is formed lower side of the free magnetic layer 16.

The seed layer 12 is formed of NiFeCr or Cr. If the seed layer 12 is formed of NiFeCr, the seed layer 12 has a face-centered cubic (fcc) structure, in which an equivalent crystal plane expressed as {111} plane is preferentially oriented in a direction parallel to a film surface. In addition, if the seed layer 12 is formed of Cr, the seed layer 12 has a body-centered cubic (bcc) structure, in which an equivalent crystal plane expressed as {110} plane is preferentially oriented in a direction parallel to a film surface.

Even though the foundation layer 11 has a nearly amorphous structure, the foundation layer 11 does not need to be formed.

It is preferable that the antiferromagnetic layer 13 formed on the seed layer 12 be formed of antiferromagnetic material containing elements X (X is one or more elements selected from a group consisting of Pt, Pd, Ir, Rh, Ru, and Os) and Mn.

The antiferromagnetic layer 13 is a layer having face-centered cubic (fcc) structure or face-centered tetragonal (fct) structure.

An X-Mn alloy using the above platinum group elements has excellent properties as an antiferromagnetic material such as excellent corrosion resistance, high blocking temperature, and is capable of increasing an exchange-coupling magnetic field (Hex). For example, a PtMn alloy or an IrMn alloy formed of a binary system can be used.

Furthermore, in the magnetic detecting element H1 shown in FIG. 1, the antiferromagnetic layer 13 can be formed of antiferromagnetic material containing elements X and X' (the element X' is one or more elements selected from a group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements), and Mn.

It is preferable to use as the element X' an element that enters the interstitial space of a space lattice consisting of the elements X and Mn or that substitutes for some of lattice points of a crystal lattice consisting of the elements X and Mn. Here, a solid solution means solids in which ingredients are uniformly mixed over a wide range.

In the magnetic detecting element H1 shown in FIG. 1, the preferable composition range of the element X' is 0.2 to 10 at % (i.e., atomic %), more preferably, 0.5 to 5 at %. Furthermore, in the aspect of the invention, the element X is preferably either Pt or Ir.

Furthermore, in the magnetic detecting element H1 shown in FIG. 1, it is preferable to set the atomic percent of the elements X or X+X' of the antiferromagnetic layer 13 in the range of 45 to 60 at %, more preferably 49 to 56.5 at %. As a result, it is estimated that, during a film forming step, an interface with the fixed magnetic layer 14 is non-aligned and the antiferromagnetic layer 13 is transformed into an ordered state by heat treatment.

The fixed magnetic layer 14 formed on the antiferromagnetic layer 13 has a three-layer structure.

The fixed magnetic layer 14 is a three-layer structure composed of magnetic layer 14a, nonmagnetic intermediate layer 14b, and magnetic layer 14c. The magnetization directions of the magnetic layer 14a and the magnetization direction of the magnetic layer 14c are made anti-parallel to each other by the exchange-coupling magnetic field at the interface with the antiferromagnetic layer 13 and an antiferromagnetic exchange-coupling magnetic field (RKKY interaction) through the nonmagnetic intermediate layer 14b. This is called a so-called artificial ferromagnetic coupled state. This configuration can stabilize magnetization of the fixed magnetic layer 14 and can increase the exchange-coupling magnetic field. The exchange-coupling magnetic filed is generated at the interface between the fixed magnetic layer 14 and the antiferromagnetic layer 13.

Here, the fixed magnetic layer 14 can be formed as a monolayer or multilayer structure of a magnetic material layer.

The magnetic layer 14a is, for example, about 15 to 35 Å thick; the nonmagnetic intermediate layer 14b is about 8 to 10 Å thick; and the magnetic layer 14c is about 20 to 50 Å thick.

The nonmagnetic intermediate layer 14b is formed of a nonmagnetic conductive material such as Ru, Rh, Ir, Cr, Re, and Cu.

It is preferable that the magnetic layers 14a and 14c of the fixed magnetic layer 14 be a $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn). The $Co_2YZ$ alloy layer is a half-metallic material that is effective to increase the product $\Delta RA$. The product $\Delta RA$ is the resistance variation $\Delta R$ of a CPP-GMR type magnetic detecting element times the area A of the element.

The nonmagnetic material layer 15 formed on the fixed magnetic layer 14 is formed of Cu, Au, or Ag.

Moreover, the free magnetic layer 16 is formed on the fixed magnetic material layer. The structure of the free magnetic layer 16 will be described below.

In the embodiment shown in FIG. 1, hard bias layers 18 and 18 are formed at both ends of the free magnetic layer 16. Magnetization of the free magnetic layer 16 is directed in a track width direction (the X direction in the drawing) by a lengthwise bias magnetic field of the hard bias layers 18 and 18. The hard bias layers 18 and 18 are formed of, for example, Co—Pt (cobalt-platinum) alloy, Co—Cr—Pt (cobalt-chromium-platinum) alloy or the like.

The top, bottom, and end of each hard bias layer 18 and 18 are insulated by insulating layers 19 and 19 formed of alumina or the like.

The electrode layers 20 and 20 are provided on the upper side and lower side of the multilayer film T1, thereby forming a CPP (Current Perpendicular to the Plane)-GMR magnetic detecting element, in which a sense current is allowed to flow in a direction perpendicular to the film surface of each layer constituting the multilayer film T1.

The electrode layers 20 and 20 are formed of α-Ta, Au, Cr, Cu (copper), Rh, Ir, Ru, W (tungsten) or the like.

Hereinafter, the invention will be described.

The free magnetic layer 16 is a laminated body of a $Co_2MnZ$ alloy layer 16a (Z is one or more elements selected from a group consisting of Al, Sn, In, Sb, Ga, Si, Ge, Pb, and Zn) and a $Co_aFe_{100-a}$ alloy layer 16b ('a' indicates composition ratio, $76 \leqq a \leqq 100$). The composition ratio 'a' is at % of Co in CoFe.

In the magnetic detecting element H1 shown in FIG. 1, heat treatment is performed after the protective layer 17 is laminated from the foundation layer 11, thereby generating an exchange-coupling magnetic field at the interface between the antiferromagnetic layer 13 and the fixed magnetic layer 14. In this case, if the magnetic field is oriented in a direction parallel to the Y direction in the drawing, magnetization of the fixed magnetic layer 14 is fixed in a direction parallel to the Y direction in the drawing. In the embodiment shown in FIG. 1, since the fixed magnetic layer 14 is in an artificial ferrimagnetic structure, if the magnetic layer 14a is magnetized, for example, in the Y direction in the drawing, the magnetic layer 14c and magnetic layer 14a are magnetized in a direction opposite to the Y direction in the drawing.

In addition, the $Co_2MnZ$ alloy layer 16a of the free magnetic layer 16 is a regular lattice.

In the magnetic detecting element shown in FIG. 1, the magnetization of the fixed magnetic layer and the free magnetic layer are perpendicular to each other. A leakage magnetic field from the recording medium is in the Y direction of the magnetic detecting element in the drawing; the magnetization of the free magnetic layer changes with good sensitivity; electric resistance changes by the relationship between the change of the magnetization direction and the fixed magnetization direction of the fixed magnetic layer; and a voltage or current changes on the basis of the change of the electric resistance; therefore, the leakage magnetic field from the recording medium is detected.

The $Co_2MnZ$ alloy forming the $Co_2MnZ$ alloy layer 16a of the free magnetic layer 16 is a Heusler alloy. The Heusler alloy is a general term of a metallic compound having a Heusler type crystal structure and shows ferromagnetic properties according to the composition. The $Co_2MnZ$ alloy is a metal with high spin polarizability and has half-metallic properties, in which most conduction electrons are formed of only either up-spin electrons or down-spin electrons.

When the free magnetic layer 16 of the CPP-GMR type magnetic detecting element has the $Co_2MnZ$ alloy layer 16a, the variation in the spin diffusion length or mean free path of conduction electrons within the free magnetic layer 16 increases before and after an external magnetic field is applied. That is, the variation in the resistance of the multi-layer film increases, and the detection sensitivity of the external magnetic field is improved.

However, if the free magnetic layer 16 is a single layer structure of the $Co_2MnZ$ alloy layer 16a, the magnetostriction constant λs or coercive force Hc of the free magnetic layer 16 becomes larger, thus endangering the stability of the detection sensitivity of the magnetic field.

Here, as shown in FIG. 1, when the $Co_2MnZ$ alloy layer 16a overlays the $Co_aFe_{100-a}$ alloy layer 16b ('a' indicates composition ratio, $76 \leq a \leq 100$), the magnetostriction constant λs or coercive force Hc of the free magnetic layer 16 can be decreased. This is because, if the composition ratio of the elements Co and Fe of the $Co_aFe_{100-a}$ alloy layer 16b is set in the above-described range, the magnetostriction constant λs of the $Co_aFe_{100-a}$ alloy layer 16b becomes negative, and the coercive force Hc can be decreased.

As described above, the free magnetic layer 16 is a laminated body of the $Co_2MnZ$ alloy layer 16a (Z is one or more elements selected from a group consisting of Al, Sn, In, Sb, Ga, Si, Ge, Pb, and Zn) and the $Co_aFe_{100-a}$ alloy layer 16b ('a' indicates composition ratio, $76 \leq a \leq 100$). Furthermore, the composition ratio 'a' is at % of Co in CoFe.

In the invention, if the composition ratio of the $Co_aFe_{100-a}$ alloy layer 16b that overlays the $Co_2MnZ$ alloy layer 16a is set as described above, the magnetostriction constant λs of the $Co_aFe_{100-a}$ alloy layer 16b becomes negative, and the coercive force Hc can be decreased, thereby improving soft magnetic properties of the free magnetic layer 16.

Particularly, when 'a' of the $Co_aFe_{100-a}$ alloy layer 16b is set in the range of $76 \leq a \leq 90$, the magnetostriction constant λs of the $Co_aFe_{100-a}$ alloy layer 16b becomes negative, and the magnetostriction constant λs and coercive force Hc of the free magnetic layer 16 are decreased. Therefore, it is possible to effectively improve the soft magnetic properties of the free magnetic layer 16, and thus, preferably, the free magnetic layer 16 can be put into practical use.

In addition, as shown in FIG. 1, since the $Co_aFe_{100-a}$ alloy layer 16b is in contact with the nonmagnetic material layer 15, the magnetostriction constant λs of the $Co_aFe_{100-a}$ alloy layer 16b can be decreased, compared with the structure, in which the $Co_2MnZ$ alloy layer 16a is in contact with the nonmagnetic material layer 15. This is caused by the following fact: the nonmagnetic material layer 15 composed of Cu has a face-centered cubic (fcc) structure and an equivalent crystal face expressed as a {111} plane preferentially oriented in a direction parallel to a film surface, and thus the $Co_aFe_{100-a}$ alloy layer 16b can have a face-centered cubic (fcc) structure and an equivalent crystal face expressed as a {111} plane preferentially oriented in a direction parallel to a film surface by setting the composition of the $Co_aFe_{100-a}$ alloy layer 16b in contact with the nonmagnetic material layer 15. That is, if the $Co_aFe_{100-a}$ alloy layer 16b has a face-centered cubic (fcc) structure and an equivalent crystal plane expressed as a {111} plane preferentially oriented in a direction parallel to a film surface, the magnetostriction constant λs of the $Co_aFe_{100-a}$ alloy layer 16b can be decreased.

Furthermore, a film thickness t1 of the $Co_aFe_{100-a}$ alloy layer 16b is preferably in the range of 10 to 30 Å. If the film thickness t1 of the $Co_aFe_{100-a}$ alloy layer 16b is set in the above-described range, the magnetostriction constant λs of the $Co_aFe_{100-a}$ alloy layer 16b can be decreased, and the $Co_aFe_{100-a}$ alloy layer 16b can be put into practical use.

A film thickness t2 of the $Co_2MnZ$ alloy layer 16a is preferably in the range of 40 to 80 Å. If the film thickness t2 of the $Co_2MnZ$ alloy layer 16a is 40 Å or more, the $Co_2MnZ$ alloy layer 16a is improved in crystallinity and regularity.

Even though the nonmagnetic material layer 15 composed of Cu has a face-centered cubic (fcc) structure and an equivalent crystal face expressed as a {111} plane preferentially oriented in a direction parallel to a film surface, the {111} plane of the face-centered cubic (fcc) structure is the densest packed plane, and since the densest packed plane is exposed on the surface of the nonmagnetic material layer 15, the atoms of the $Co_aFe_{100-a}$ alloy layer 16b laminated on the nonmagnetic material layer 15 can be prevented from diffusing into the nonmagnetic material layer 15.

Furthermore, the $Co_2MnZ$ alloy layer 16a composed of Heusler alloy is to be ordered, in which each element is disposed in a designated position in a crystal lattice; therefore heat treatment is performed after film-forming to promote ordering of the $Co_2MnZ$ alloy layer 16a, however, even when the heat treatment is performed, interfacial diffusion of the $Co_aFe_{100-a}$ alloy layer 16b and the nonmagnetic material layer 15 formed below the $Co_2MnZ$ alloy layer 16a can be minimized.

The free magnetic layer 16 can have an artificial ferrimagnetic structure by laminating a nonmagnetic intermediate layer such as Ru or the like and the other magnetic layer on the laminated body of the $Co_2MnZ$ alloy layer 16a and the $Co_aFe_{100-a}$ alloy layer 16b.

Figure 2:
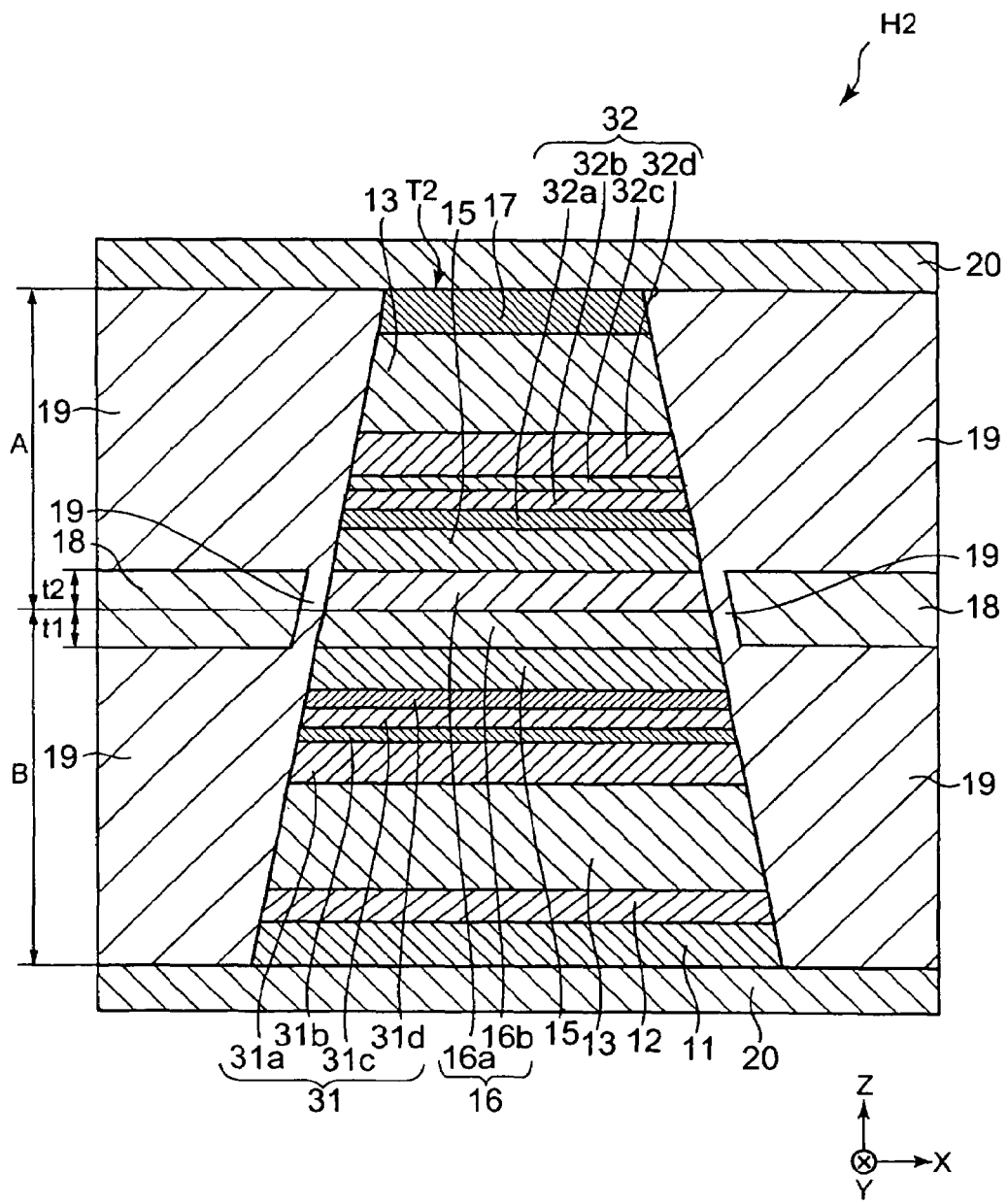
FIG. 2 is a cross-sectional view of the structure of a magnetic detecting element (dual spin valve type magnetic resistance effect element) according to a second embodiment of the invention as viewed from a surface facing a recording medium.

FIG. 2 is a partially cross-sectional view showing the structure of a dual spin valve type magnetic detecting element H2 according to the invention. The magnetic detecting element H2 shown in FIG. 2 has the same components as those of the magnetic detecting element H1 shown in FIG. 1. Therefore, the same components of the magnetic detecting element H2 shown in FIG. 2 as those of the magnetic detecting element H1 shown in FIG. 1 are denoted by the same reference numerals, and the detailed description thereof will be omitted.

As shown in FIG. 2, a foundation layer 11, a seed layer 12, an antiferromagnetic layer 13, a fixed magnetic layer 31, a nonmagnetic material layer 15, and a free magnetic layer 16 are sequentially laminated from the bottom. Moreover, on the free magnetic layer 16, a nonmagnetic material layer 15, a fixed magnetic layer 32, an antiferromagnetic layer 13, and a protective layer 17 are laminated continuously so as to form a multilayer film T2.

Furthermore, hard bias layers 18 and 18 are laminated on both ends of the free magnetic layer 16. The hard bias layers 18 and 18 are insulated by insulating layers 19 and 19 formed of alumina or the like.

The electrode layers 20 and 20 are provided on upper and lower sides of the multilayer film T2, thereby forming a CPP (Current Perpendicular to the Plane)-GMR magnetic detecting elements, in which a sense current is allowed to flow perpendicularly to the film surface of each layer constituting the multilayer film T2.

In addition, in FIG. 2, the layers, to which the same reference numerals as those in FIG. 1 are given, are formed of the same material.

The fixed magnetic layer 31 of the magnetic detecting element shown in FIG. 2 is a four-layer structure composed of a magnetic layer 31a, a nonmagnetic intermediate layer 31b, a magnetic layer 31c, and the Heusler alloy layer 31d. The magnetic layer 31a and the magnetic layer 31c are formed of ferromagnetic material such as CoFe or the like, and the Heusler alloy layer 31d is formed of the Heusler alloy to be described below. The Heusler alloy layer 31d is ferromagnetic, and the magnetic layer 31c and the Heusler alloy layer 31d have the same magnetization direction by ferromagnetic coupling.

The magnetization directions of the magnetic layer 31a and the magnetization direction of the magnetic layer 31c and the Heusler alloy layer 31d are made anti-parallel to each other by the exchange-coupling magnetic field at the interface with the antiferromagnetic layer 13 and the antiferromagnetic exchange-coupling magnetic field (RKKY interaction) passing the nonmagnetic intermediate layer 31b.

If the Heusler alloy layer 31d is provided in the fixed magnetic layer 31 of the CPP-GMR type magnetic detecting element, the variation in the spin diffusion length or mean free path of conduction electrons within the multilayer film T2 increases before and after an external magnetic field is applied. That is, the variation in the resistance of the multilayer film T2 increases, and the detection sensitivity of the external magnetic field is improved. Furthermore, even though the Heusler alloy layer 31d can be laminated under the nonmagnetic intermediate layer 31b, since the layer in contact with the nonmagnetic material layer 15 contributes to a magnetic resistance effect, it is more effective to laminate the Heusler alloy layer on the nonmagnetic intermediate layer 31b.

It is preferable that The Heusler alloy layer 31d, one layer of the fixed magnetic layer 31, be a $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn). The $Co_2YZ$ alloy layer is a material that has half-metallic property and that is effective to increase the product ΔRA. The product ΔRA is the resistance variation ΔR of the CPP-GMR type magnetic detecting element times the area A of the element.

It is more preferable that the Heusler alloy layer 31d be formed of metallic compounds having a composition formula such as $Co_2MnZ$. Here, Z is one or more elements selected from a group consisting of Al, Ga, Si, Ge, Sn, In, Sb, Pb, and Zn.

Otherwise, it is preferable that the Heusler alloy layer 31d be formed by using a $(Co_{0.67}Fe_{0.33})_{100-a}Z_a$ alloy (Z is one or more elements selected from a group consisting of Al, Ga, Si, Ge, and a is at % $0 \leq a \leq 30$). The 'a' indicating at % of the $(Co_{0.67}Fe_{0.33})_{100-a}Z_a$ alloy layer is in the range of preferably $7 \leq a \leq 30$ and more preferably $22 \leq a \leq 28$. The Z of the $(Co_{0.67}Fe_{0.33})_{100-a}Z_a$ alloy is, for example, either Al or Ga or both. Alternatively, the Z of the $(Co_{0.67}Fe_{0.33})_{100-a}Z_a$ alloy is, for example, Al.

Since the $(CO_{0.67}Fe_{0.33})_{100-a}Z_a$ alloy layer is half metallic, the product ΔRA of the magnetic detecting element can be increased. In addition, since the $(Co_{0.67}Fe_{0.33})_{100-a}Z_a$ alloy has larger magnetostriction than CoMnGe alloy or CoMnGa alloy, if the $(Co_{0.67}Fe_{0.33})_{100-a}Z_a$ alloy is used to form layers constituting the fixed magnetic layer 31, the uniaxial anisotropy of the fixed magnetic layer 31 can be enhanced.

The fixed magnetic layer 32 of the magnetic detecting element shown in FIG. 2 has a four-layer structure consisting of the Heusler alloy layer 32a, a magnetic layer 32b, a nonmagnetic intermediate layer 32c, and a magnetic layer 32d. The magnetic layer 32b and the magnetic layer 32d are formed of ferromagnetic material such as CoFe or the like and the Heusler alloy layer 32a is formed of the same Heusler alloy as the Heusler alloy that forms the Heusler alloy layer 31d of the above-described fixed magnetic layer 31. The magnetic layer 32b is ferromagnetic, and thus the Heusler alloy layer 32a and the magnetic layer 32b have the same magnetization direction by ferromagnetic coupling.

The magnetization directions of the magnetic layer 32d and the magnetization direction of the Heusler alloy layer 32a and the magnetic layer 32b are made anti-parallel to each other by the exchange-coupling magnetic field at the interface with the antiferromagnetic layer 13 on the fixed magnetic layer 32 and the antiferromagnetic exchange-coupling magnetic field (RKKY interaction) passing the nonmagnetic intermediate layer 32c.

If the Heusler alloy layer 32a is inserted in the middle of the fixed magnetic layer 32 of the CPP-GMR type magnetic detecting element, the variation in the spin diffusion length or mean free path of conduction electrons within the multilayer film T2 increases before and after an external magnetic field is applied. That is, the variation in the resistance of the multilayer film T2 increases, and the detection sensitivity of the external magnetic field is improved. Furthermore, even though the Heusler alloy layer 32a can be laminated on the nonmagnetic intermediate layer 32c, since the layer in contact with the nonmagnetic material layer 15 contributes to a magnetic resistance effect, it is more effective to laminate the Heusler alloy layer under the nonmagnetic intermediate layer 32c.

The fixed magnetic layer 31 and the fixed magnetic layer 32 can be formed as a structure that does not have an artificial ferrimagnetic structure. Furthermore, the fixed magnetic layer 31 shown in FIG. 2 can be used instead of the fixed magnetic layer 14 of the magnetic detecting element H1 of FIG. 1.

In the magnetic detecting element shown in FIG. 2, magnetization of the fixed magnetic layer 31 and 32 and magnetization of the free magnetic layer 16 are perpendicular to each other. A leakage magnetic field from the recording medium enters into the magnetic detecting element H2 in the Y direction in the drawing; magnetization of the free magnetic layer 16 changes with good sensitivity; electric resistance changes by the relationship between the change of the magnetization direction and the fixed magnetization direction of the fixed magnetic layer 31 and 32; and a voltage or current changes on the basis of the change of the electric resistance, thereby detecting the leakage magnetic field from the recording medium. In the dual spin valve type magnetic detecting element H2 shown in FIG. 2, since the fixed magnetic layer 32 and the fixed magnetic layer 31 are formed on the upper side and lower side of the free magnetic layer 16 with the antiferromagnetic layer 15 therebetween, theoretically, the product $\Delta RA$ of the resistance variation $\Delta R$ and the area A of the element can be twice that of the single spin valve type magnetic detecting element shown in FIG. 1. In the case of the magnetic detecting element H2 shown in FIG. 2, it is possible to set $\Delta RA$ of the magnetic detecting element H2 to 5 m$\Omega \mu m^2$ or more.

The free magnetic layer 16 is a laminated body of the $Co_2MnZ$ alloy layer 16a (Z is one or more elements selected from a group consisting of Al, Sn, In, Sb, Ga, Si, Ge, Pb, and Zn) and the $Co_aFe_{100-a}$ alloy layer 16b ('a' indicates composition ratio, $76 \leqq a \leqq 100$). Furthermore, the composition ratio 'a' is at % of Co in CoFe.

The $Co_2MnZ$ alloy forming the $Co_2MnZ$ alloy layer 16a of the free magnetic layer 16 is the Heusler alloy. The Heusler alloy is a general term of a metallic compound having a Heusler type crystal structure and shows ferromagnetic properties according to the composition. The $Co_2MnZ$ alloy is a metal with high spin polarizability and has half-metallic properties, in which most conduction electrons are formed of either up-spin electrons or down-spin electrons.

When the free magnetic layer 16 of the CPP-GMR type magnetic detecting element has the $Co_2MnZ$ alloy layer 16a, the variation in the spin diffusion length or mean free path of conduction electrons within the free magnetic layer 16 increases before and after an external magnetic field is applied. That is, the variation in the resistance of the multilayer film increases, and thus the detection sensitivity of the external magnetic field is improved.

However, if the free magnetic layer 16 is a single layer structure of the $Co_2MnZ$ alloy layer 16a, the magnetostriction constant $\lambda s$ or coercive force Hc of the free magnetic layer 16 increases, thus endangering stability of the detection sensitivity of the magnetic field.

Here, as shown in FIG. 2, when the $Co_2MnZ$ alloy layer 16a overlays the $Co_aFe_{100-a}$ alloy layer 16b ('a' indicates composition ratio, $76 \leqq a \leqq 100$), the magnetostriction constant $\lambda s$ or coercive force Hc of the free magnetic layer 16 can be decreased. This is because if the composition ratio of the elements Co and Fe of the $Co_aFe_{100-a}$ alloy layer 16b is set in the above-described range, the magnetostriction constant $\lambda s$ of the $Co_aFe_{100-a}$ alloy layer 16b becomes negative, and the coercive force Hc can be decreased.

In addition, even in the magnetic detecting element H2 shown in FIG. 2, if the composition ratio of the $Co_aFe_{100-a}$ alloy layer 16b that overlays the $Co_2MnZ$ alloy layer 16a is set as described above, the magnetostriction constant $\lambda s$ of the $Co_aFe_{100-a}$ alloy layer 16b becomes negative, and the magnetostriction constant $\lambda s$ and coercive force Hc of the free magnetic layer 16 can be decreased, thereby improving soft magnetic properties of the free magnetic layer 16.

Particularly, when 'a' of the $Co_aFe_{100-a}$ alloy layer 16b is set $76 \leqq a \leqq 90$, the magnetostriction constant $\lambda s$ of the $Co_aFe_{100-a}$ alloy layer 16b becomes negative, and the magnetostriction constant $\lambda s$ and the coercive force Hc of the free magnetic layer 16 is decreased. Therefore, it is possible to effectively improve soft magnetic properties of the free magnetic layer 16, and, preferably, the free magnetic layer 16 is suitable for practical use.

In addition, as shown in FIG. 2, if the $Co_aFe_{100-a}$ alloy layer 16b is in contact with either of two nonmagnetic material layers 15 that are formed on and below the $Co_aFe_{100-a}$ alloy layer 16b, the magnetostriction constant $\lambda s$ of the $Co_aFe_{100-a}$ alloy layer 16b can be decreased, compared to the structure, in which the $Co_2MnZ$ alloy layer 16a is in contact with the nonmagnetic material layer 15. This is caused by the following fact: the nonmagnetic material layer 15 composed of Cu has a face-centered cubic (fcc) structure and an equivalent crystal face expressed as a {111} plane preferentially oriented in a direction parallel to a film surface, and thus the $Co_aFe_{100-a}$ alloy layer 16b can have a face-centered cubic (fcc) structure and an equivalent crystal face expressed as a {111} plane preferentially oriented in a direction parallel to a film surface by setting the composition of the $Co_aFe_{100-a}$ alloy layer 16b in contact with the nonmagnetic material layer 15. That is, if the $Co_aFe_{100-a}$ alloy layer 16b has a face-centered cubic (fcc) structure and an equivalent crystal face expressed as a {111} plane preferentially oriented in a direction parallel to a film surface, the magnetostriction constant $\lambda s$ of the $Co_aFe_{100-a}$ alloy layer 16b can be decreased.

Furthermore, a film thickness t1 of the $Co_aFe_{100-a}$ alloy layer 16b is preferably in the range of 10 to 30 Å. If the film thickness t1 of the $Co_aFe_{100-a}$ alloy layer 16b is set in the above-described range, the magnetostriction constant $\lambda s$ of the $Co_aFe_{100-a}$ alloy layer 16b can be decreased, and the $Co_aFe_{100-a}$ alloy layer 16b can be put to practical use.

A film thickness t2 of the $Co_2MnZ$ alloy layer 16a is preferably in the range of 40 to 80 Å. If the film thickness t2 of the $Co_2MnZ$ alloy layer 16a is 40 Å or more, the $Co_2MnZ$ alloy layer 16a is improved in crystallinity and regularity.

Even though the nonmagnetic material layer 15 composed of Cu has a face-centered cubic (fcc) structure and an equivalent crystal face expressed as a {111} plane preferentially oriented in a direction parallel to a film surface, the {111} plane of the face-centered cubic (fcc) structure is the densest packed plane, and since the densest packed plane is exposed on the surface of the nonmagnetic material layer 15, the atoms of the $Co_aFe_{100-a}$ alloy layer 16b laminated on the nonmagnetic material layer 15 formed on the lower side (the opposite side to the Z direction in the drawing) can be prevented from diffusing into the nonmagnetic material layer 15.

In the embodiment shown in FIG. 2, even though the $Co_aFe_{100-a}$ alloy layer 16b is formed on the nonmagnetic material layer 15 formed on the lower side (the opposite side to the Z direction in the drawing), and, instead of the $Co_aFe_{100-a}$ alloy layer 16b, the $Co_2MnZ$ alloy layer 16a is formed beneath the nonmagnetic material layer 15 formed on the upper side (the Z direction side in the drawing), the application of the invention is not limited to this structure, and it is possible that the $Co_2MnZ$ alloy layer 16a is formed on the nonmagnetic material layer 15 formed on the lower side and the $Co_aFe_{100-a}$ alloy layer 16b is formed beneath the nonmagnetic material layer 15 formed on the upper side.

The $Co_2MnZ$ alloy layer 16a is formed of a Heusler alloy, in which each element is disposed in a designated position by a crystal lattice after film forming, and heat treatment is performed to promote ordering of the $Co_2MnZ$ alloy layer 16a. However, even when the heat treatment is performed, interfacial diffusion of the $Co_aFe_{100-a}$ alloy layer 16b and the nonmagnetic material layer 15 formed below the $Co_2MnZ$ alloy layer 16a can be minimized.

The free magnetic layer 16 can have an artificial ferrimagnetic structure by laminating a nonmagnetic intermediate layer such as Ru or the like and the other magnetic layer on the laminated body of the $Co_2MnZ$ alloy layer 16a and the $Co_aFe_{100-a}$ alloy layer 16b.

In addition, when, of the $Co_2MnZ$ alloy layer 16a and the $Co_aFe_{100-a}$ alloy layer 16b, one located on a lower side is defined as a lower free magnetic layer and the other located on an upper side is an upper free magnetic layer, and when, of a multilayer film lower part B composed of the lower free magnetic layer, the nonmagnetic material layer 15 and the fixed magnetic layer 31, which are located beneath the lower free magnetic layer, and a multilayer film upper part A composed of the upper free magnetic layer, the nonmagnetic material layer 15 and the fixed magnetic layer 31, which are located on the upper free magnetic layer, one located at the upstream of the conduction electron flow is defined as a multilayer film upstream part, and the other located at the downstream of the conduction electron flow is defined as a multilayer film downstream part, it is preferable that the product ΔRA of the magnetic resistance variation of the multilayer film upstream part and the area of the element be smaller than the product ΔRA of the multilayer film downstream part.

As a result, it is possible to reduce noise due to spin transfer torque (STT).

The spin transfer torque is a torque that transfers spin angular momentum of conduction electrons to spin angular momentum of magnetic materials forming the free magnetic layer 16 and the fixed magnetic layers 31 and 32 and fluctuates the spin angular momentum of the free magnetic layer 16, when current is allowed to flow perpendicular to the film surface of the multilayer film T2, in which the free magnetic layer 16, the nonmagnetic material layer 15, and the fixed magnetic layers 31 and 32 are laminated.

Spin transfer torque generated when conduction electrons are allowed to flow in a direction toward the fixed magnetic layers 31 and 32 from the free magnetic layer 16 is smaller than spin transfer torque generated when conduction electrons are allowed to flow in a direction toward the free magnetic layer 16 from the fixed magnetic layers 31 and 32.

When the multilayer film upstream part of the multilayer film T2 of the magnetic detecting element H2 is made asymmetric with the multilayer film downstream part, and thus the product ΔRA of the magnetic resistance variation of the multilayer film upstream part and the area of the element is decreased than the product ΔRA of the multilayer film downstream part, the spin transfer torque applied to the free magnetic layer 16 of the dual spin valve type magnetic detecting element H2 can be sufficiently offset. Theoretically, it is possible to reduce the spin transfer torque applied to the free magnetic layer 16 to zero.

In the magnetic detecting element shown in FIG. 2, even though the $Co_aFe_{100-a}$ alloy layer 16b is the lower free magnetic layer and the $Co_2MnZ$ alloy layer 16a is an upper free magnetic layer, the $Co_2MnZ$ alloy layer 16a can be the lower free magnetic layer.

In the multilayer film upper part A and the multilayer film lower part B, the product ΔRA of the multilayer film upper part A including the $Co_2MnZ$ alloy layer 16a is made greater. Therefore, in the case of the dual spin valve type magnetic detecting element H2 shown in FIG. 2, if conduction electrons are allowed to flow from the bottom to the top, and the multilayer film lower part B forms the multilayer film upstream part and the multilayer film upper part A forms the multilayer film downstream part, the product ΔRA of the multilayer film upstream part decreases than the product ΔRA of the multilayer film downstream part.

In the magnetic detecting element shown in FIG. 2, even though the $Co_aFe_{100-a}$ alloy layer 16b is the lower free magnetic layer and the $Co_2MnZ$ alloy layer 16a is an upper free magnetic layer, the $Co_2MnZ$ alloy layer 16a can be the lower free magnetic layer and the $Co_aFe_{100-a}$ alloy layer 16b can be the upper free magnetic layer.

When constructed as above, the conduction electrons are allowed to flow from the top to bottom; the multilayer film upper part A forms the multilayer film upstream part; and the multilayer film lower part B forms the multilayer film downstream part, the product ΔRA of the multilayer film upstream part decreases than the product ΔRA of the multilayer film downstream part.

Figure 3:
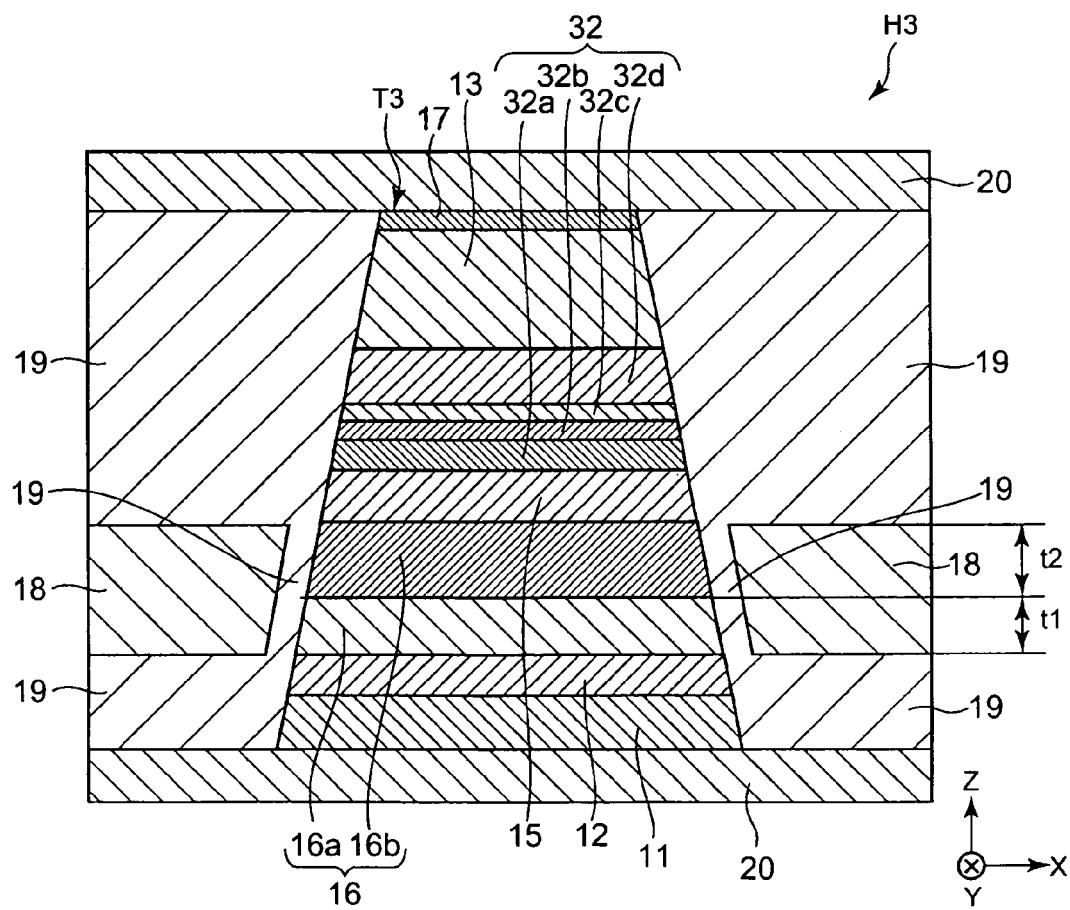
FIG. 3 is a cross-sectional view of the structure of a magnetic detecting element (single spin valve type magnetic resistance effect element) according to a third embodiment of the invention as viewed from a surface facing a recording medium.

FIG. 3 is a partial cross-sectional view showing the structure of a top spin valve type magnetic detecting element H3 according to the invention. The magnetic detecting element H2 shown in FIG. 3 has the same components as those of the magnetic detecting element H1 shown in FIG. 1 and the magnetic detecting element H2 shown in FIG. 2. Therefore, the same components of the magnetic detecting element H3 shown in FIG. 3 as those of the magnetic detecting element H1 shown in FIG. 1 or the magnetic detecting element H2 shown in FIG. 2 are denoted by the same reference numerals, and detailed description thereof will be omitted.

As shown in FIG. 3, the foundation layer 11, the seed layer 12, the free magnetic layer 16, the nonmagnetic material layer 15, the fixed magnetic layer 32, an antiferromagnetic layer 13, and the protective layer 17 are continuously laminated from the bottom so as to form a multilayer film T3.

Furthermore, hard bias layers 18 and 18 are laminated on both sides of the free magnetic layer 41. The hard bias layers 18 and 18 are insulated by insulating layers 19 and 19 formed of alumina or the like.

The electrode layers 20 and 20 are provided on and below the multilayer film T3, thereby forming a CPP (Current Perpendicular to the Plane)-GMR magnetic detecting elements, in which a sense current is allowed to flow perpendicular to the film surface of each layer constituting the multilayer film T3.

In addition, in FIG. 3, the layers, to which the same reference numerals as those in FIGS. 1 and 2 are given, are formed of the same material.

Furthermore, even in the magnetic detecting element H3 shown in FIG. 3, the free magnetic layer 16 is a laminated body of the $Co_2MnZ$ alloy layer 16a (Z is one or more elements selected from a group consisting of Al, Sn, In, Sb, Ga, Si, Ge, Pb, and Zn) and the $Co_aFe_{100-a}$ alloy layer 16b ('a' indicates composition ratio, $76 \leq a \leq 100$). Furthermore, the composition ratio 'a' is at % of Co in CoFe.

Here, as shown in FIG. 3, when the $Co_2MnZ$ alloy layer 16a overlays the $Co_aFe_{100-a}$ alloy layer 16b ('a' indicates composition ratio, $76 \leq a \leq 100$), the magnetostriction constant λs or coercive force Hc of the free magnetic layer 16 can be decreased. This is because if the composition ratio of the elements Co and Fe of the $Co_aFe_{100-a}$ alloy layer 16b is set in the above-described range, the magnetostriction constant λs of the $Co_aFe_{100-a}$ alloy layer 16b becomes negative, and the coercive force Hc can be decreased.

In the magnetic detecting element H3 shown in FIG. 3, if the composition ratio of the $Co_aFe_{100-a}$ alloy layer 16b that overlays the $CO_2MnZ$ alloy layer 16a is set as described above, the magnetostriction constant λs of the $Co_aFe_{100-a}$ alloy layer 16b becomes negative, and the magnetostriction constant λs and the coercive force Hc of the free magnetic layer 16 can be decreased, thereby improving soft magnetic properties of the free magnetic layer 16.

Particularly, when 'a' of the $Co_aFe_{100-a}$ alloy layer 16b is set to $76 \leq a \leq 90$, the magnetostriction constant λs of the $Co_aFe_{100-a}$ alloy layer 16b becomes negative, and the magnetostriction constant λs and coercive force Hc of the free magnetic layer 16 are decreased. Therefore, it is possible to effectively improve soft magnetic properties of the free magnetic layer 16, and, preferably, the free magnetic layer 16 is suitable for practical use.

In addition, as shown in FIG. 3, if the $Co_aFe_{100-a}$ alloy layer 16b is in contact with the nonmagnetic material layer 15, the magnetostriction constant λs of the $Co_aFe_{100-a}$ alloy layer 16b can be decreased, compared to the structure, in which the $Co_2MnZ$ alloy layer 16a is in contact with the nonmagnetic material layer 15. This is caused by the following fact: the nonmagnetic material layer 15 composed of Cu has a face-centered cubic (fcc) structure and an equivalent crystal face expressed as a {111} plane preferentially oriented in a direction parallel to a film surface, and thus the $Co_aFe_{100-a}$ alloy layer 16b can have a face-centered cubic (fcc) structure and an equivalent crystal face expressed as a {111} plane preferentially oriented in a direction parallel to a film surface by setting the composition of the $Co_aFe_{100-a}$ alloy layer 16b in contact with the nonmagnetic material layer 15. That is, if the $Co_aFe_{100-a}$ alloy layer 16b has a face-centered cubic (fcc) structure and an equivalent crystal face expressed as a {111} plane preferentially oriented in a direction parallel to a film surface, the magnetostriction constant λs of the $Co_aFe_{100-a}$ alloy layer 16b can be decreased.

Furthermore, a film thickness t1 of the $Co_aFe_{100-a}$ alloy layer 16b is preferably in the range of 10 to 30 Å. If the film thickness t1 of the $Co_aFe_{100-a}$ alloy layer 16b is set in the above-described range, the magnetostriction constant λs of the $Co_aFe_{100-a}$ alloy layer 16b can be decreased, and thus the $Co_aFe_{100-a}$ alloy layer 16b can be put to practical use.

A film thickness t2 of the $Co_2MnZ$ alloy layer 16a is preferably in the range of 40 to 80 Å. If the film thickness t2 of the $Co_2MnZ$ alloy layer 16a is 40 Å or more, the $Co_2MnZ$ alloy layer 16a has improved crystallinity and order.

In the magnetic detecting elements H1, H2 and H3 shown in FIGS. 1 to 3, the magnetization directions of the fixed magnetic layers 14, 31, and 32 are fixed by the exchange-coupling magnetic field at the interface with the antiferromagnetic layer 13. However, it is also possible that the antiferromagnetic layer 13 does not overlay the fixed magnetic layers 14, 31, and 32, and the fixed magnetic layers 14, 31, and 32 is a self-pinning structure, in which the magnetization directions of the fixed magnetic layers 14, 31, and 32 are fixed by the uniaxial anisotropy of the fixed magnetic layers 14, 31, and 32.

EXAMPLE 1

Dual spin valve type magnetic detecting elements having different composition ranges and film thicknesses of the $Co_aFe_{100-a}$ alloy layer 16b forming the free magnetic layer 16 were formed, and then the magnetostriction constant λs of these magnetic detecting elements were checked.

The film structure of the dual spin valve type magnetic detecting element adopted in the experiments will be described below. The figures in parentheses indicate film thicknesses.

Substrate/Ta (30 Å)/NiFeCr (50 Å)/IrMn (70 Å)/$Co_{70}Fe_{30}$ (30 Å)/Ru (9.1 Å)/$Co_{60}Fe_{40}$ (10 Å)/CoMnGe (40 Å)/Cu (43 Å)/free magnetic layer ($Co_{70}Fe_{30}$ (X Å))/CoMnGe (50 Å))/Cu (43 Å)/CoMnGe (50 Å)/$Co_{60}Fe_{40}$ (10 Å)/Ru (9.1 Å) $Co_{60}Fe_{40}$ (30 Å))/IrMn (70 Å)/Ta (30 Å).

As described above, a layer formed by laminating a CoMnFe (50 Å) on a $Co_{70}Fe_{30}$ (X Å) alloy layer 16b as the $Co_2MnZ$ alloy layer 16a is adopted as the free magnetic layer 16.

Figure 4:
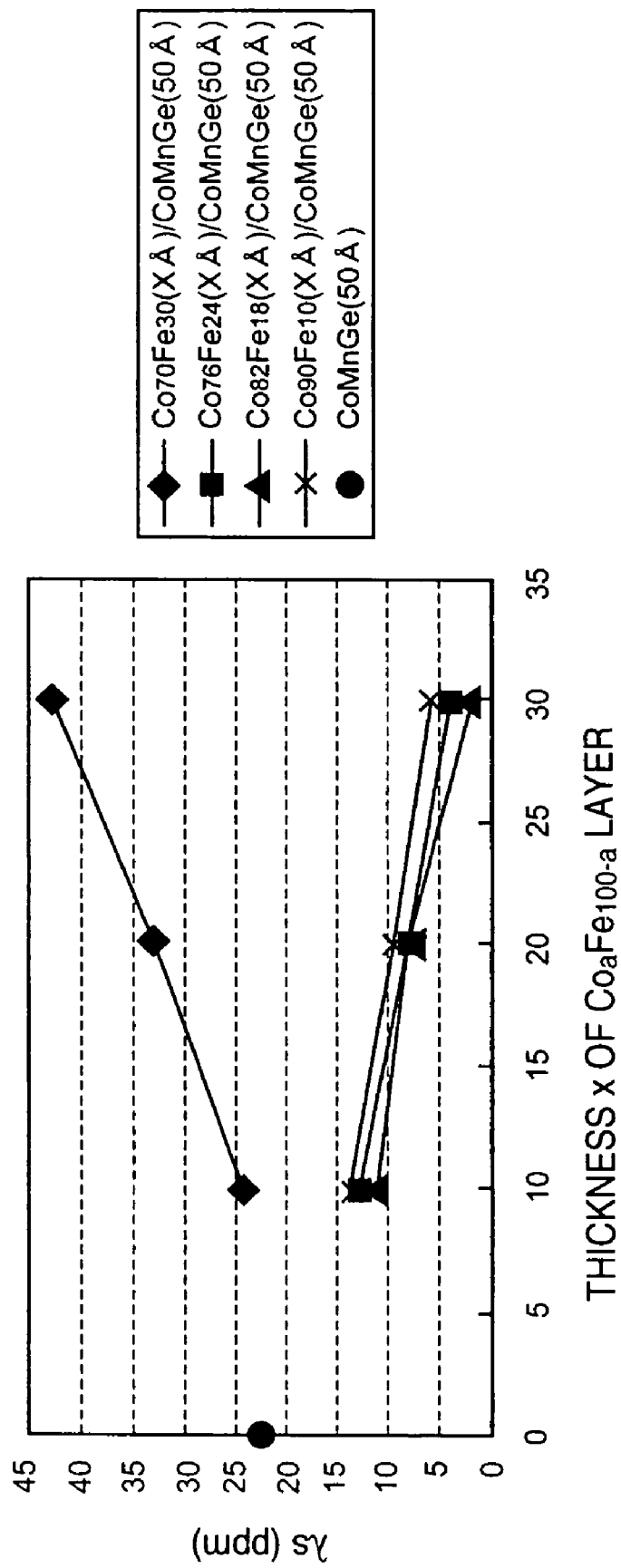
FIG. 4 is a graph showing the relationship between the thickness of a $Co_aFe_{100-a}$ alloy layer and the magnetostriction constant λs.
Figure 5:
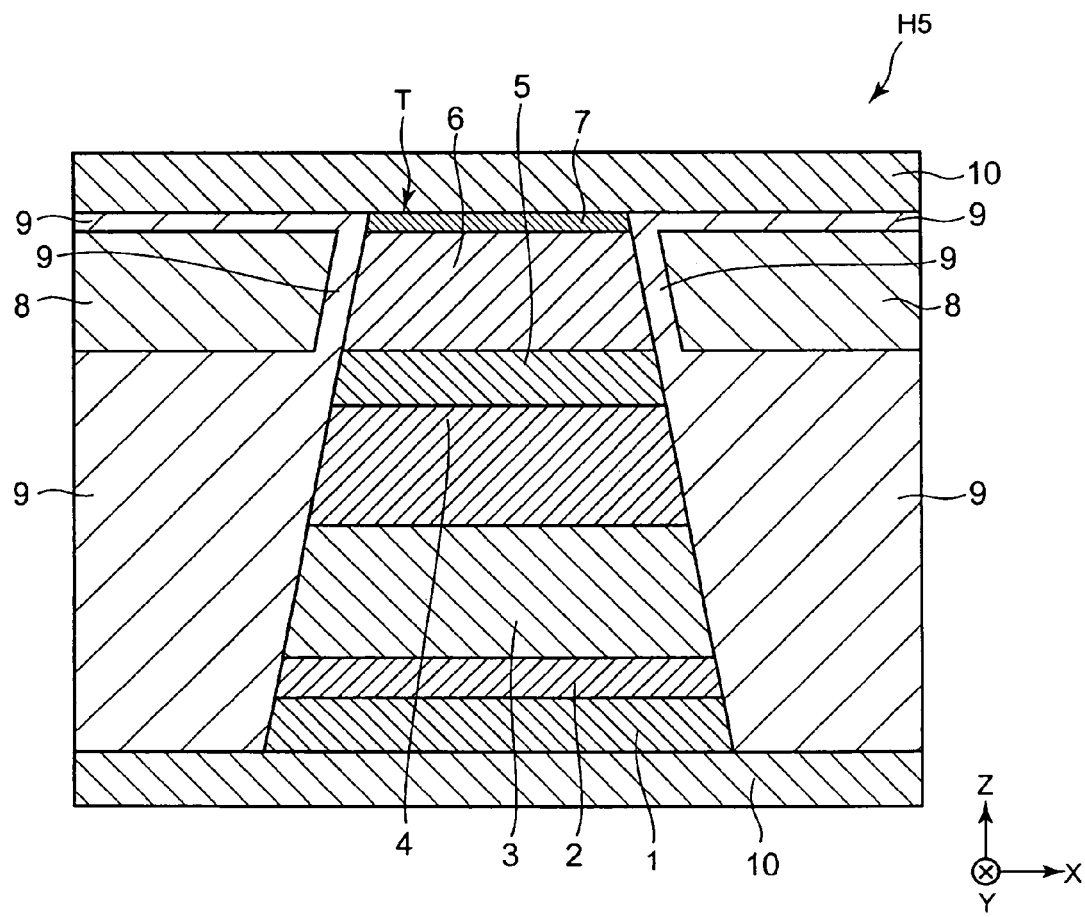
FIG. 5 is a cross-sectional view of a related art magnetic detecting element.

FIG. 4 is a graph showing the relationship between the thickness of the $Co_aFe_{100-a}$ alloy layer 16b and the magnetostriction constant λs.

As shown in FIG. 4, when the composition ratio (at %) of Co in the $Co_aFe_{100-a}$ alloy layer 16b is 76% or more, the magnetostriction constant λs can be reduced to 15 (ppm) or less, and thus the alloy layer becomes suitable for practical use.

In addition, when the composition ratio (at %) of Co in the $Co_aFe_{100-a}$ alloy layer 16b is 90% or more, the magnetostriction constant λs can be reduced to 15 (ppm) or less, and thus the alloy layer becomes suitable for practical use.

Furthermore, when the film thickness t1 of the $Co_aFe_{100-a}$ alloy layer 16b is in the range of 10 to 30 Å, the magnetostriction constant λs can be reduced to 15 (ppm) or less, and thus the alloy layer becomes suitable for practical use.

The invention claimed is:

1. A magnetic detecting element comprising:
   a multilayer film that has a fixed magnetic layer, a magnetization direction of which is fixed in one direction, and a free magnetic layer formed on the fixed magnetic layer with a nonmagnetic material layer therebetween, a current flowing in a direction perpendicular to a film surface of each layer of the multilayer film,
   wherein the free magnetic layer has a laminated body of a $Co_2MnZ$ alloy layer (Z is one or more elements selected from a group consisting of Al, Sn, In, Sb, Ga, Si, Ge, Pb, and Zn) and a $Co_aFe_{100-a}$ alloy layer ('a' indicates composition ratio, 76≦a≦100), and the $Co_aFe_{100-a}$ alloy layer is in contact with the nonmagnetic material layer.

2. The magnetic detecting element according to claim 1, wherein a film thickness of the $Co_aFe_{100-a}$ alloy layer is in a range of 10 to 30 Å.

3. The magnetic detecting element according to claim 1, wherein the magnetostriction constant λs of the free magnetic layer is in a range of 0 to 15 ppm.

4. The magnetic detecting element according to claim 1, wherein the fixed magnetic layer has a $Co_2YZ$ alloy layer (Y is one or more elements selected from a group consisting of Mn, Fe, and Cr, and Z is one or more elements selected from a group consisting of Al, Ga, Si, Ge, Sn, In, Sb, Pb, and Zn).

5. The magnetic detecting element according to claim 1, wherein the fixed magnetic layer is provided on the free magnetic layer.

6. The magnetic detecting element according to claim 1, wherein the fixed magnetic layer is provided below the free magnetic layer.

7. The magnetic detecting element according to claim 1, wherein the nonmagnetic material layer and the fixed magnetic layer are provided below the free magnetic layer, and another nonmagnetic material layer and fixed magnetic layer are provided on the free magnetic layer.

8. A magnetic detecting element comprising:
   a multilayer film that has a fixed magnetic layer, a magnetization direction of which is fixed in one direction, and a free magnetic layer formed on the fixed magnetic layer with a nonmagnetic material layer therebetween, a current flowing in a direction perpendicular to a film surface of each layer of the multilayer film,
   wherein the free magnetic layer has a laminated body of a $Co_2MnZ$ alloy layer (Z is one or more elements selected from a group consisting of Al, Sn, In, Sb, Ga, Si, Ge, Pb, and Zn) and a $Co_aFe_{100-a}$ alloy layer, and
   the $Co_aFe_{100-a}$ alloy layer has a face-centered cubic (fcc) structure, in which an equivalent crystal face expressed as a {111} plane is oriented in a direction parallel to a film surface, and the $Co_aFe_{100-a}$ alloy layer is in contact with the nonmagnetic material layer.

9. The magnetic detecting element according to claim 8, wherein the free magnetic layer is formed by laminating upper and lower free magnetic layers directly or with the other magnetic or other nonmagnetic material layer therebetween, and, when, of a multilayer film lower part composed of the lower free magnetic layer, the nonmagnetic material layer and the fixed magnetic layer, which are located beneath the lower free magnetic layer, and a multilayer film upper part composed of the upper free magnetic layer, the other nonmagnetic material layer and the other fixed magnetic layer, which are located on the upper free magnetic layer, one located upstream of conduction electron flow is defined as a multilayer film upstream part, and the other located downstream of the conduction electron flow is defined as a multilayer film downstream part, a product $\Delta RA$ of the magnetic resistance variation and element area of the multilayer film upstream part is smaller than a product $\Delta RA$ of the multilayer film downstream part.

* * * * *